(12) United States Patent
Miyaji et al.

(10) Patent No.: US 7,265,962 B2
(45) Date of Patent: Sep. 4, 2007

(54) ELECTROSTATIC CHUCK AND PRODUCTION METHOD THEREFOR

(75) Inventors: Shinya Miyaji, Yokohama (JP); Xinwei Chen, Yokohama (JP); Shinji Saito, Yokohama (JP)

(73) Assignee: NHK Spring Co., Ltd., Kanagawa (JP)

( * ) Notice: Subject to any disclaimer, the term of this patent is extended or adjusted under 35 U.S.C. 154(b) by 140 days.

(21) Appl. No.: 10/814,304

(22) Filed: Apr. 1, 2004

(65) Prior Publication Data

US 2004/0196614 A1    Oct. 7, 2004

(30) Foreign Application Priority Data

Apr. 2, 2003    (JP) ............... 2003-099467

(51) Int. Cl.
*H01T 23/00*    (2006.01)
(52) U.S. Cl. ...................... 361/234; 219/390
(58) Field of Classification Search ................ 361/234
See application file for complete search history.

(56) References Cited

U.S. PATENT DOCUMENTS

| | | | |
|---|---|---|---|
| 5,618,350 A | 4/1997 | Ishikawa et al. ............ 118/725 |
| 5,625,526 A * | 4/1997 | Watanabe et al. ............ 361/234 |
| 6,376,808 B2 | 4/2002 | Tachikawa et al. ......... 219/444.1 |
| 6,646,233 B2 * | 11/2003 | Kanno et al. ................ 219/390 |
| 6,771,483 B2 * | 8/2004 | Harada et al. ............... 361/234 |

FOREIGN PATENT DOCUMENTS

| | | |
|---|---|---|
| JP | 05-009740 | 1/1993 |
| JP | 05-206030 | 8/1993 |
| JP | 08-218172 | 8/1996 |
| JP | 2002-203660 | 7/2002 |
| JP | 2002-203661 | 7/2002 |

* cited by examiner

*Primary Examiner*—Robert L. Deberadinis
*Assistant Examiner*—Luis E. Román
(74) *Attorney, Agent, or Firm*—Arent Fox LLP

(57) ABSTRACT

The present invention provides an electrostatic chuck comprising a substrate, a dielectric layer formed by thermal spraying on an upper face of the substrate, an internal electrode embedded in the dielectric layer, a feeder terminal portion extending from a lower face of the substrate to the internal electrode, and an electrode provided in the feeder terminal portion, wherein the feeder terminal portion and the substrate are fixed to each other by mechanical joining.

4 Claims, 5 Drawing Sheets

ELECTROSTATIC CHUCK AND PRODUCTION METHOD THEREFOR

BACKGROUND OF THE INVENTION

1. Field of the Invention

The present invention relates to electrostatic chucks formed in processing chambers of semiconductor processing apparatuses, and relates to production methods therefor. In particular, the present invention relates to an electrostatic chuck which can be repeatedly used under high temperature conditions during semiconductor production and in which a feeder terminal portion can be reused, and relates to a production method therefor.

2. Description of the Related Art

Electrostatic chucks are provided in processing chambers for semiconductor production. Wafers are attracted to be fixed to the electrostatic chuck, and semiconductors are formed thereon. As shown in FIG. 1, the electrostatic chuck is provided with a substrate 1, a dielectric layer 2, and a feeder terminal portion 3. Medium channels 1a are appropriately formed in the substrate 1. The upper face of the substrate 1 is covered with the dielectric layer 2. An internal electrode 2a is embedded in the dielectric layer 2. The feeder terminal portion 3 extends from the lower side of the substrate 1 to the internal electrode 2a. An electrode 3a is embedded in the feeder terminal portion 3. In the feeder terminal portion 3, various structures thereof have been proposed in recent years since the feeder terminal portion 3 is an important member of the electrostatic chuck, on which bias voltage is applied by an external device.

In conventional techniques relating to devices having a feeder terminal, for example, a feeder terminal connection structure of a ceramic heater is disclosed in Japanese Unexamined Patent Application Publication No. 2002-203660 and Japanese Unexamined Patent Application Publication No. 2002-203661 as described below. That is, the ceramic heater has a ceramic substrate having a heating face and a heating element on the face opposite to the heating face thereof. The feeder terminal connection structure of the ceramic heater has a feeder terminal which is clipped at the edge portion of the heating element and is electrically connected thereto. In a case in which the above technique relating to the feeder terminal is applied to an electrostatic chuck as shown in FIG. 2, a feeder terminal portion 11 is structured such that an electrode 11a is covered with a sprayed coating 11b and a resin layer 11c, and the sprayed coating 11b is covered with a resin layer 11d. An electrostatic chuck is obtained such that the above feeder terminal portion 11 is integrated with a metal substrate 12a and a dielectric layer 13 having an internal electrode 13a therein. In the chamber used during semiconductor production, the lower side of the feeder terminal portion 11 is under the air, and the upper portion of the dielectric layer 13 is under a vacuum. Therefore, good gas-tightness is required to fix the above members of the feeder terminal portion 11 to each other and to fix the above members thereof and the substrate 12 to each other. Due to this, adhesives are used to fix the electrode 11a, sprayed coating 11b, and resin layers 11c and 11d to each other, and are used in fixing these members 11a, 11b, 11c and 11d and the substrate 12 to each other.

However, in the electrostatic chuck as shown in FIG. 2, the above members 11a, 11b, 11c, 11d and 12 were fixed to each other via the adhesives, and the temperature in the chamber during semiconductor production was more than 200° C. Due to this, the above members 11a, 11b, 11c, 11d and 12 were insecurely fixed to each other, and the gas-tightness thereamong was degraded. In addition, in some cases, vacuum leak occurred via the electrostatic chuck in the chamber. Due to this, electrical discharge may occur between the electrode 11a and the substrate 12 and dielectric breakdown may occur therebetween. When the dielectric breakdown occurs therebetween, the feeder terminal portion must be replaced with a new one. However, it is difficult to replace the feeder terminal portion with a new one in the above case in which the feeder terminal portion is fixed to the substrate via adhesives. The dielectric layer may be destroyed when the feeder terminal portion is replaced with a new one.

The insulation property of the dielectric layer 13 of the electrostatic chuck is degraded when the chamber is repeatedly used for semiconductor production. Due to this, it is necessary to replace the dielectric layer 13 with a new dielectric layer 13. A method for replacing the dielectric layer 13 with a new dielectric layer 13 is used such that the dielectric layer 13 having internal electrode 13a is removed and a new dielectric layer 13 is formed by thermal spraying. However, when the dielectric layer 13 is completely removed, the upper portion of the feeder terminal portion 11 projects upward with respect to the substrate 12, and it is possible that it may thereby be cut. In this case, it is necessary to replace not only the dielectric layer 13 but also the feeder terminal portion 11 with new ones, and this would be contrary to the goal of conserving resources. When the dielectric layer 13 is cut in the state in which the feeder terminal portion 13 is fixed in the substrate 12, the feeder terminal portion 13 is damaged. In addition, it is difficult to respray on the substrate 12 since the processing therefor is time consuming. When respraying is possible, the number of times it can be done is limited.

Therefore, in recent years, technique improvements in electrostatic chucks are required as follows. That is, the electrostatic chuck can be repeatedly used under temperatures of more than 200° C. during semiconductor processing. It is unnecessary to replace the feeder terminal portion of the electrostatic chuck with a new one when the dielectric layer is replaced with a new one. In other words, the feeder terminal portion can be reused or can be mounted so as to be replaceable.

SUMMARY OF THE INVENTION

Objects of the present invention are to provide an electrostatic chuck which can be repeatedly used under temperatures of more than 200° C. during semiconductor processing and in which a feeder terminal portion can be reused or mounted so as to be replaceable so as to contribute to the conservation of resources, and to provide a production method for the electrostatic chuck.

In order to solve the above problems, a inventor found that a feeder terminal portion and a substrate may be fixed to each other by a mechanical joining method and the feeder terminal portion is structured so as to be removably mounted to the substrate instead of by a chemical method in which adhesives are used, whereby the upper portion of the feeder terminal portion can be prevented from being cut when a dielectric layer is replaced and the feeder terminal portion can thereby be reused. The inventor carried out various research and studies on the feeder terminal portion of the electrostatic chuck, and thereby found that an electrode, sprayed coating, and resin layer of the feeder terminal portion may be fixed to each other by brazing, diffusion bonding, or soldering instead of by using conventional adhesives having a lower melting point, whereby the stability of fixing of the above members is good under high temperatures during semiconductor processing, and dielectric breakdown due to electrical discharge can be prevented from occurring between the electrode and the substrate. The present invention has been made based on the above findings.

The present invention provides an electrostatic chuck comprising: a substrate; a dielectric layer formed by thermal spraying on an upper face of the substrate; an internal electrode embedded in the dielectric layer; a feeder terminal portion extending from a lower face of the substrate to the internal electrode; and an electrode provided in the feeder terminal portion, wherein the feeder terminal portion and the substrate are fixed to each other by mechanical joining. In particular, the feeder terminal portion may be favorably composed of members which are fixed to each other by brazing, diffusion bonding, or soldering.

In the electrostatic chuck of the present invention, the feeder terminal portion is fixed to the substrate by mechanical joining and can thereby be structured so as to be removably mounted to the substrate. Therefore, the upper portion of the feeder terminal portion can be prevented from being cut when the dielectric layer is replaced, and the feeder terminal portion of the electrostatic chuck can thereby be reused. In the case in which the feeder terminal portion is composed of members which are fixed to each other by brazing, diffusion bonding, or soldering as described above, when the temperature in a chamber, in which the electrostatic chuck is provided, is more than 200° C. during semiconductor processing, the respective members of the feeder terminal portion can be securely fixed to each other, and dielectric breakdown due to electrical discharge can be prevented from occurring between the electrode and the substrate. Therefore, the electrostatic chuck of the present invention can be repeatedly used under high temperatures during semiconductor processing.

In the electrostatic chuck of the present invention, the electrode provided in the feeder terminal portion can be made of an elastic body. This elastic body may be one of various types of spring. For example, the spring may be a coil-spring or a wave-form plate spring. Alternatively, the elastic body may be a sponge-like conductive material.

A production method for the above electrostatic chuck will be described hereinafter. This production method is favorably applied to production of the above electrostatic chuck. That is, the present invention provides a production method for an electrostatic chuck comprising steps of: forming a first dielectric layer by thermal spraying on an upper face of a substrate; providing a part of an electrode and a jig on the substrate; forming an internal electrode by thermal spraying on an upper face of the part of an electrode, the jig and the first dielectric layer, forming a second dielectric layer by thermal spraying on an upper face of the internal electrode; removing the jig from the substrate; and mounting a feeder terminal portion to the substrate by mechanical joining. In this case, the feeder terminal portion may be favorably structured so as to be removably mounted to the substrate. The feeder terminal portion may be favorably composed of members which are fixed to each other by brazing, diffusion bonding, or soldering beforehand.

In this production method for the electrostatic chuck of the present invention, after the first dielectric layer, the internal electrode and the second dielectric layer are formed in turn by thermal spraying, the jig is removed from the substrate, and the feeder terminal portion is mounted to the substrate by mechanical joining. The feeder terminal portion can thereby be removed from the substrate by releasing the mechanical joining therebetween when the dielectric layer needs to be replaced after the electrostatic chuck is produced once. Therefore, the upper portion of the feeder terminal portion can be prevented from being cut when the dielectric layer is replaced. The feeder terminal portion of the electrostatic chuck can be reused since the feeder terminal portion can be fixed to the substrate by the mechanical joining again.

In the production method for the electrostatic chuck of the present invention, the feeder terminal portion may be composed of members which are fixed to each other by brazing, diffusion bonding, or soldering beforehand. As a result, when the temperature in a chamber, in which the electrostatic chuck is provided, is more than 200° C. during semiconductor processing, the respective members of the feeder terminal portion can be securely fixed to each other, and dielectric breakdown due to electrical discharge can be prevented from occurring between the electrode and the substrate. Therefore, the electrostatic chuck of the present invention can be repeatedly used under high temperatures during semiconductor processing.

In the production method for the electrostatic chuck of the present invention, the electrode provided in the feeder terminal portion may favorably be made of an elastic body.

DESCRIPTION OF THE PREFERRED EMBODIMENTS

One embodiment of the present invention will be described hereinafter with reference to FIGS. 3A to 3F. FIGS. 3A to 3F are schematic views showing production steps of an electrostatic chuck in turn in one embodiment according to the present invention.

Figure 1:
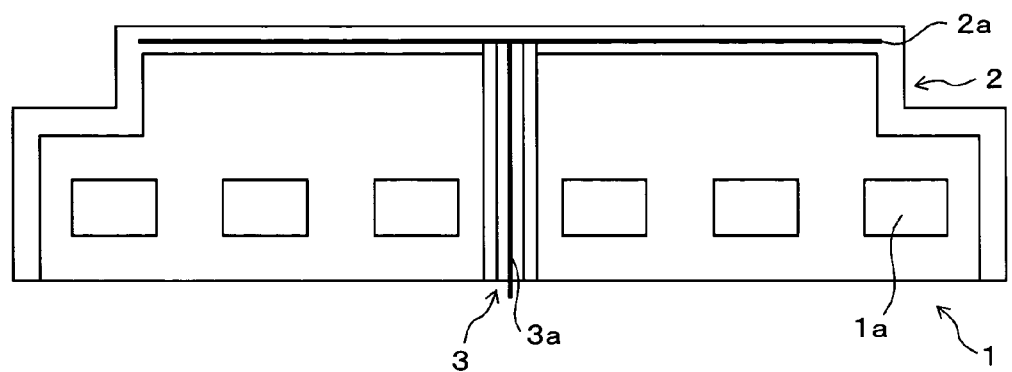
FIG. 1 is a side view showing a conventional electrostatic chuck.
Figure 2:
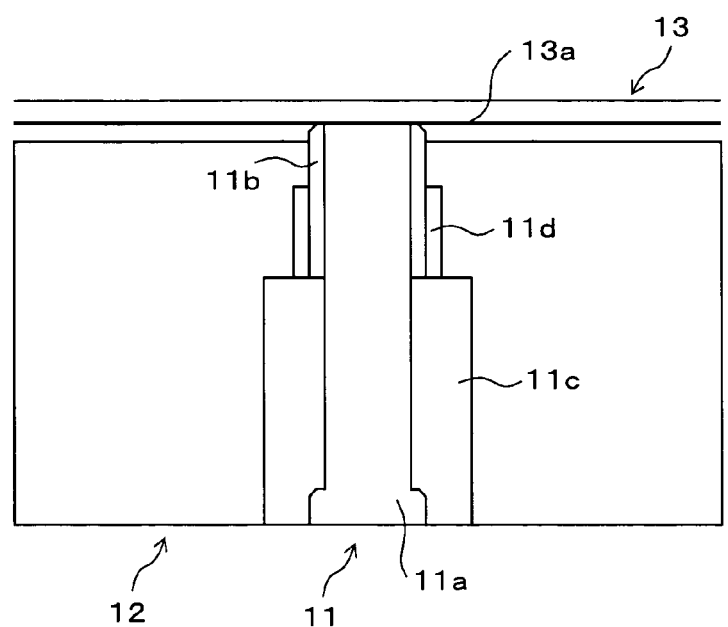
FIG. 2 is a side view showing a part of a conventional electrostatic chuck.
Figure 3A:
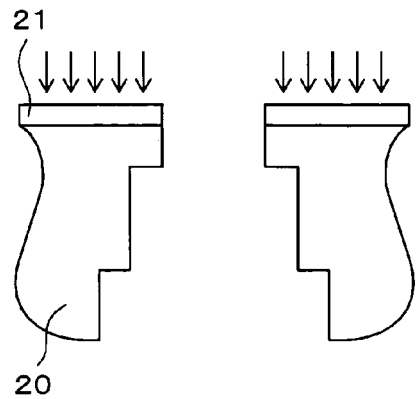
FIGS. 3A to 3F are side views showing production steps of an electrostatic chuck in turn in one embodiment according to the present invention.
Figure 3B:
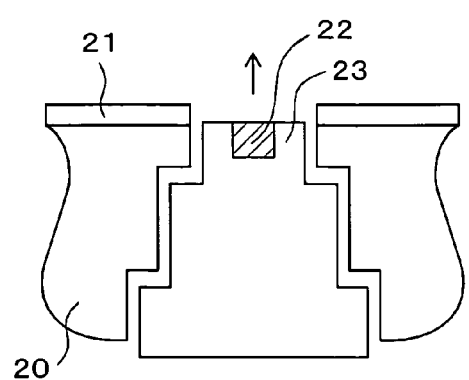
Figure 3C:
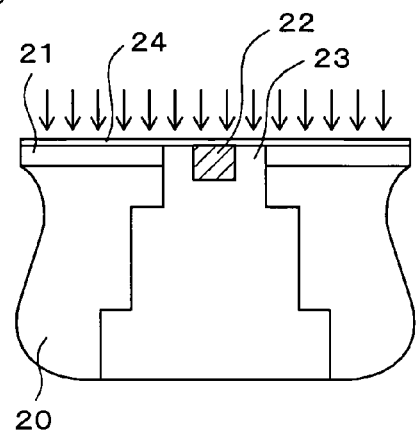
Figure 3D:
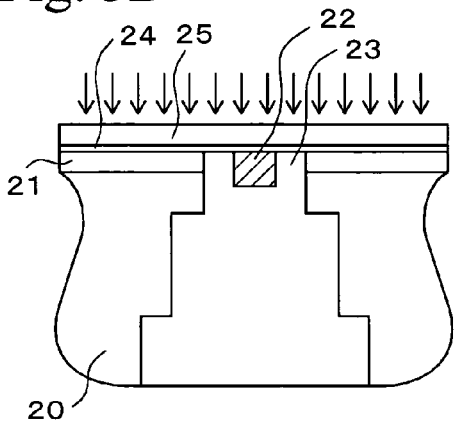
Figure 3E:
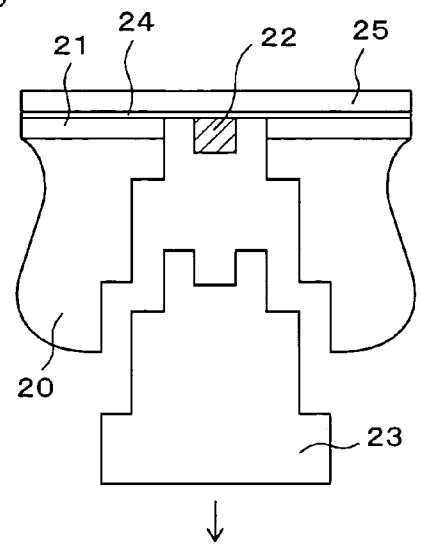
Figure 3F:
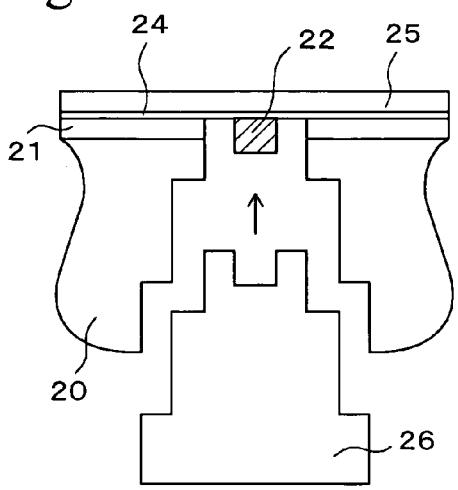

The electrostatic chuck in the embodiment is produced as follows. At first, as shown in FIG. 3A, a first dielectric layer 21 is formed by thermal spraying on an upper surface of a substrate 20. Next, as shown in FIG. 3B, a part of an electrode 22 and a jig 23 are mounted to the substrate 20. Next, as shown in FIG. 3C, an internal electrode 24 is formed by thermal spraying on the upper face of the part of the electrode 22, the jig 23 and the first dielectric layer 21. Next, as shown in FIG. 3D, a second dielectric layer 25 is formed by thermal spraying on the upper face of the internal electrode 24. Finally, as shown in FIG. 3E, the jig 23 is removed from the substrate 20, and then, as shown in FIG. 3F, a feeder terminal portion 26 is mounted to the substrate 20 by mechanical joining. The feeder terminal portion 26 is composed of respective members so as to be fixed to each other beforehand.

In the production method of the electrostatic chuck as shown in FIGS. 3A to 3F, as described above, after the first dielectric layer 21, the internal electrode 24 and the second dielectric layer 25 are formed by thermal spraying in turn, the jig 23 is removed from the substrate 20, and the feeder terminal portion 26 is mounted to the substrate 20 by mechanical joining. When the dielectric layers 21 and 25 need to be replaced after the electrostatic chuck is produced, the feeder terminal portion 26 can thereby be removed from the substrate 20 by releasing the mechanical joining therebetween. Therefore, the upper portion of the feeder terminal portion 26 can be prevented from being cut when the dielectric layers 21 and 25 are replaced with new ones. The feeder terminal portion 26 of the electrostatic chuck can be reused since the feeder terminal portion 26 can be fixed to the substrate 20 by the mechanical joining again.

In the production method of the electrostatic chuck as shown in FIGS. 3A to 3F, the feeder terminal portion 26 is composed of respective members which are fixed with each other by brazing beforehand. As a result, when the temperature in a chamber, in which the electrostatic chuck is provided, is more than 200° C. during semiconductor processing, the respective members of the feeder terminal portion 26 can be securely fixed to each other, and dielectric breakdown due to electrical discharge can be prevented from occurring between the electrode and the substrate 20. Therefore, the electrostatic chuck of the present invention can be repeatedly used under high temperatures during semiconductor processing.

Various examples of the production method for the electrostatic chuck will be described hereinafter, based on the above production method in one embodiment according to the present invention.

(1) FIRST EXAMPLE

Figure 4:
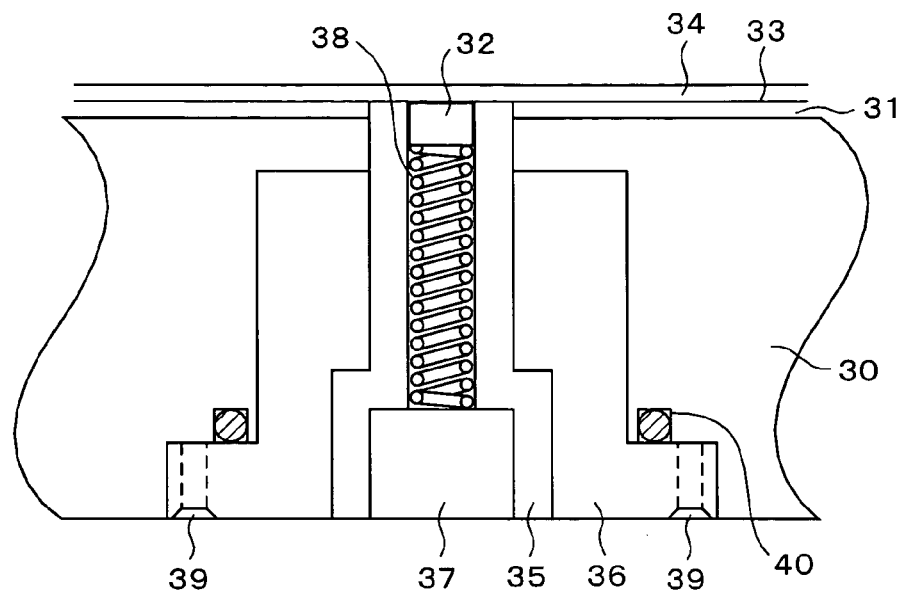
FIG. 4 is a side view showing an example of an electrostatic chuck in one embodiment according to the present invention.

FIG. 4 is a schematic diagram showing the first example of an electrostatic chuck of the present invention. In the production for the electrostatic chuck of the first example, a first dielectric layer 31 is formed by thermal spraying on a substrate 30 made of aluminum, and an electrode 32 as a conductor is mounted with a jig (not shown) to the central portion of the substrate 30. Next, an internal electrode 33 made of tungsten is formed by thermal spraying on the substrate 30, the electrode 32 and the jig. Next, a second dielectric layer 34 is formed by thermal spraying on the internal electrode 33, and then the jig is removed from the substrate 30. On the other hand, a feeder terminal portion is produced beforehand such that an insulation member 35 made of a ceramic of magnesium oxide and aluminum oxide, a bush 36 and an electrode 37 are joined with each other by brazing, diffusion bonding, soldering, or other means, and a metal spring 38 is inserted thereinto. The feeder terminal portion is mounted to the substrate 30 so that the upper portion of the metal spring 36 contacts the electrode 32, and is integrated therewith by a bolt 39 and a seal 40. A heat-resisting O-ring such as a kalrez, or a metal gasket can be used as the above seal 40. In the above manner, the electrostatic chuck of the first example is produced. Since the gas-tightness when fixing the above respective members is well maintained, the electrostatic chuck of the first example can be repeatedly used under high temperatures during semiconductor production. The feeder terminal portion is mechanically mounted to the substrate 30, and can thereby be reused. An elastic body (not shown) is at least inserted into one part between the electrode 32 and the metal spring 38. At least one contact portion of the electrode 32 is not fixed but is electrically connected thereto.

(2) SECOND EXAMPLE

Figure 5:
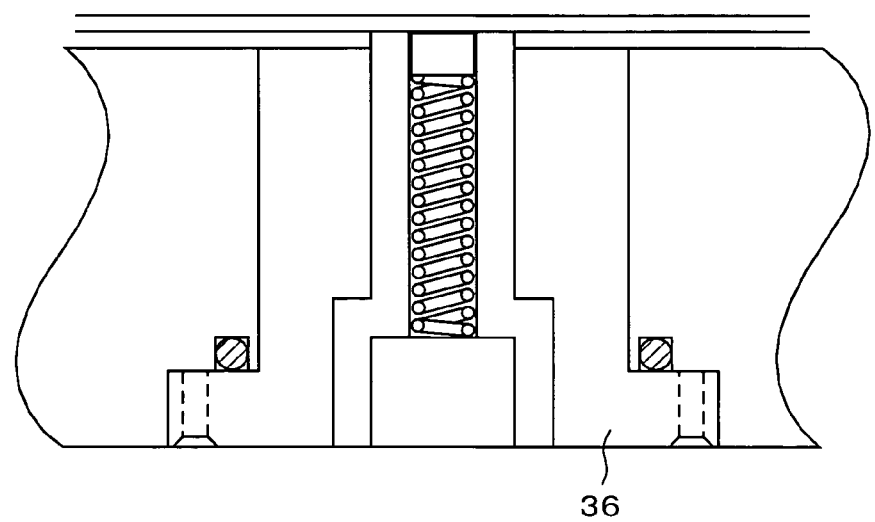
FIG. 5 is a side view showing another example of an electrostatic chuck in one embodiment according to the present invention.

FIG. 5 is a schematic diagram showing the second example of an electrostatic chuck of the present invention. The electrostatic chuck of the second example is produced in the same manner as that of the above first example. The electrostatic chuck as shown in FIG. 5 is different from that of the first example in the shape of the bush 36. In addition, the electrostatic chuck as shown in FIG. 5 is different from that of the first example in using brazing for securing the gas-tightness when fixing the respective members thereof. In the electrostatic chuck of the second example which is produced in the above manner, since the gas-tightness when fixing the above respective members thereof is well maintained, the electrostatic chuck of the second example can be repeatedly used under high temperatures during semiconductor production.

(3) THIRD EXAMPLE

Figure 6:
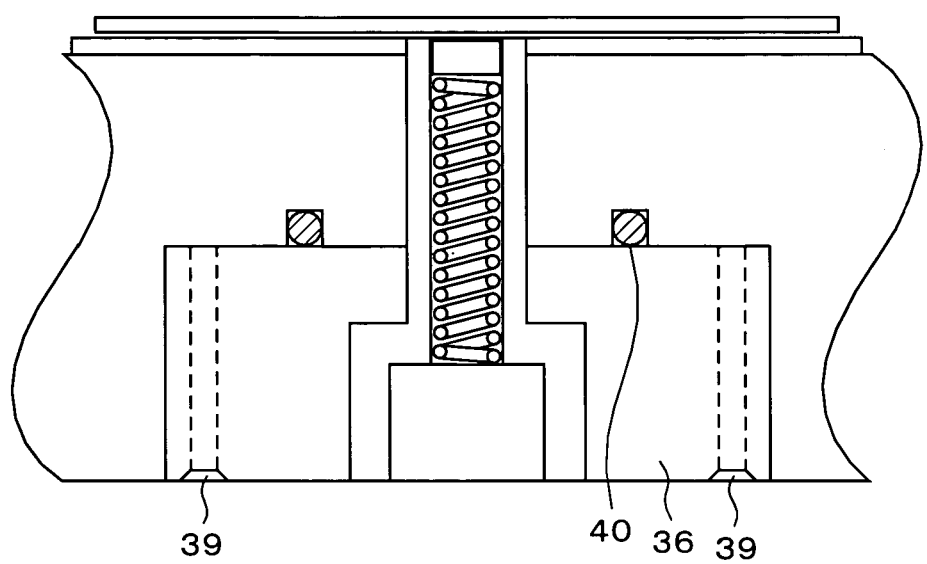
FIG. 6 is a side view showing another example of an electrostatic chuck in one embodiment according to the present invention.

FIG. 6 is a schematic diagram showing the third example of an electrostatic chuck of the present invention. The electrostatic chuck of the third example is produced in the same manner as that of the above second example. The electrostatic chuck as shown in FIG. 6 is different from that of the second example in the shape of the bush 36, thereby being different from that of the second example in the length of the bolt 39 and the position of the seal 40. In the electrostatic chuck of the third example which is produced in the above manner, since the gas-tightness when fixing the above respective members thereof is well maintained, the electrostatic chuck of the third example can be repeatedly used under high temperatures during semiconductor production.

(4) FOURTH EXAMPLE

Figure 7:
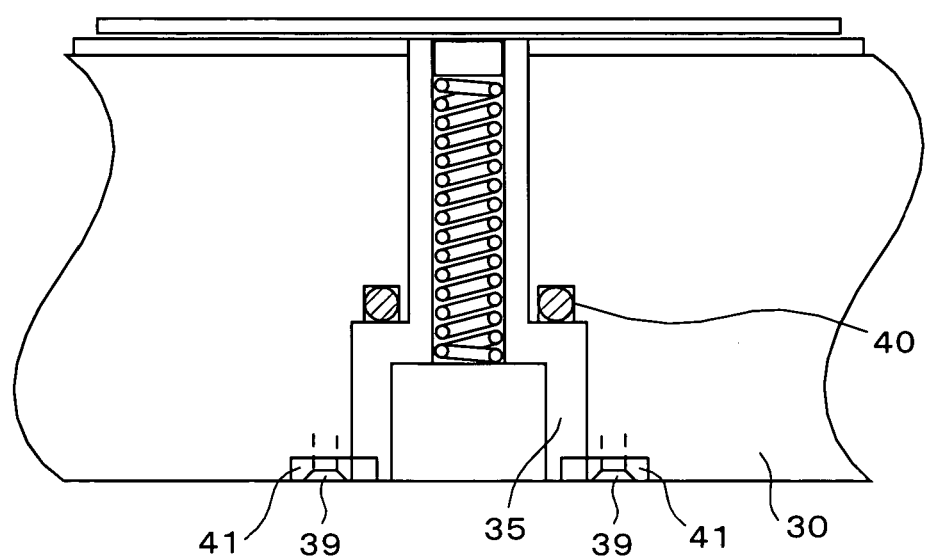
FIG. 7 is a side view showing another example of an electrostatic chuck in one embodiment according to the present invention.

FIG. 7 is a schematic diagram showing the fourth example of an electrostatic chuck of the present invention. The electrostatic chuck of the fourth example is produced in the same manner as that of the above second example. The electrostatic chuck as shown in FIG. 7 is different in not using the bush 36 and thereby directly mounting the insulating member 35 to the substrate 30 from the electrostatic chuck of the second example, thereby being different from the electrostatic chuck of the second example in placing a washer 41 in the joining portion of the bolt 39 and in the position of the seal 40. In the electrostatic chuck of the fourth example which is produced in the above manner, since the gas-tightness when fixing the above respective members thereof is well maintained, the electrostatic chuck of the fourth example can be repeatedly used under high temperatures during semiconductor production.

(5) FIFTH EXAMPLE

Figure 8:
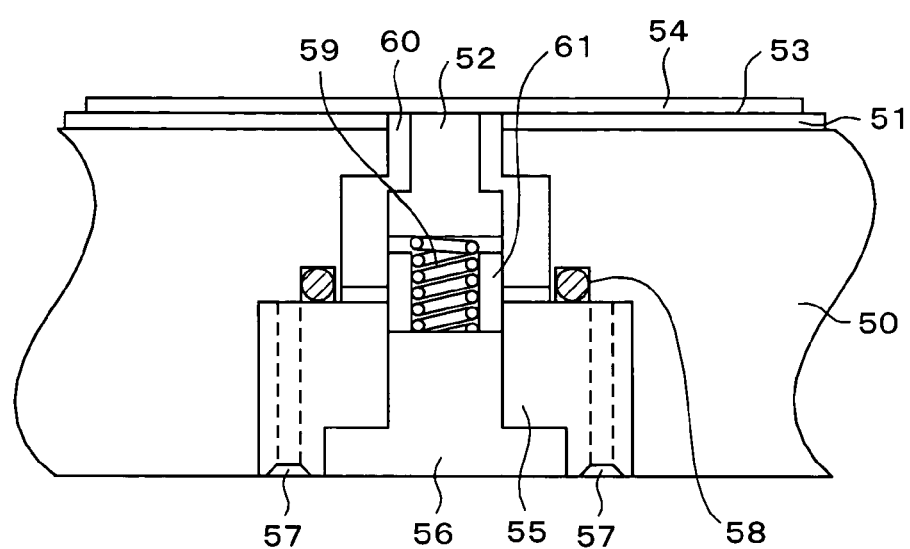
FIG. 8 is a side view showing another example of an electrostatic chuck in one embodiment according to the present invention.

FIG. 8 is a schematic diagram showing the fifth example of an electrostatic chuck of the present invention. In production for the electrostatic chuck of the fifth example, a first dielectric layer 51 is formed by thermal spraying on a substrate 50 made of aluminum, and an electrode 52 as a conductor is mounted with a jig (not shown) to the central portion of the substrate 50. Next, an internal electrode 53 made of tungsten is formed by thermal spraying on the substrate 50, the electrode 52, and the jig. Next, a second dielectric layer 54 is formed by thermal spraying on the internal electrode 53, and then the electrode 52 and the jig are removed from the substrate 50. On the other hand, a joint is produced beforehand such that an insulation member 55 made of ceramic of magnesium oxide and aluminum oxide, and an electrode 56 are joined with each other by brazing, diffusion bonding, soldering, or other means. A spring 59, to which an electrode 52 is mounted, a insulation member 60 made of a ceramic, and an insulation member 61 are inserted into the substrate 50, and then a joint having the insulation member 55 and the electrode 56 is mechanically joined thereto by a bolt 57 and a seal 58. Brazing is used for securing the gas-tightness when fixing the respective members thereof. A heat-resisting O-ring such as a kalrez, or a metal gasket can be used as the above seal 58. In the above manner, the electrostatic chuck of the fifth example is produced. Since the gas-tightness when fixing the above respective members is well maintained, the electrostatic chuck of the fifth example can be repeatedly used under high temperatures during semiconductor production. The feeder terminal portion is mechanically mounted to the substrate 30, and can thereby be reused. An elastic body (not shown) is at least inserted into one part between the electrode 52 and the internal electrode 53. At least one contact portion of the electrode 52 is not fixed but is electrically connected thereto.

What is claimed is:

1. An electrostatic chuck comprising:
   a substrate;
   a dielectric layer formed by thermal spraying on an upper face of the substrate;
   an internal electrode embedded in the dielectric layer;
   a feeder terminal portion extending from a lower face of the substrate to the internal electrode and having a recess; and
   an electrode provided in the recess of the feeder terminal portion,
   wherein the feeder terminal portion has members and the electrode and the members of the feeder terminal portion are fixed to each other by brazing, diffusion bonding, or soldering,
   the dielectric layer has a substrate side recess formed on a surface of the dielectric layer, the surface being located proximate to the feeder terminal portion,
   the internal electrode has an exposed portion which is exposed to the feeder terminal portion in the substrate side recess,
   the substrate has a substrate side electrode provided at the exposed portion of the internal electrode in the substrate side recess so as to be apart from the dielectric layer and to project from the substrate side recess to the electrode of the feeder terminal portion,
   the feeder terminal portion having the electrode and the substrate having the substrate side electrode are removably fixed to each other by mechanical joining, and
   in the mechanical joining, the substrate side electrode is fit into the recess of the feeder terminal portion and contacts the electrode of the feeder terminal portion.

2. The electrostatic chuck according to claim 1, wherein the electrode provided in the feeder terminal portion is made of an elastic body.

3. A production method for an electrostatic chuck comprising steps of:
   forming a first dielectric layer by thermal spraying on an upper face of a substrate;
   providing a substrate side electrode and a jig on the substrate;
   forming an internal electrode by thermal spraying on upper faces of the substrate side electrode, the jig and the first dielectric layer,
   forming a second dielectric layer by thermal spraying on an upper face of the internal electrode;
   removing the jig from the substrate; and
   removably mounting a feeder terminal portion to the substrate by mechanical joining, the feeder terminal portion having a recess and an electrode provided in the recess, the substrate having the substrate side electrode.
   wherein of the electrode and members of the feeder terminal portion are fixed to each other by brazing, diffusion bonding, or soldering beforehand,
   in the step of forming the internal electrode, a substrate side recess is formed on a surface of the first dielectric layer, the surface being located proximate to the feeder terminal portion, the internal electrode has an exposed portion which is exposed to the feeder terminal portion in the substrate side recess, and the substrate side electrode is provided at the exposed portion of the internal electrode in the substrate side recess so as to be apart from the first dielectric layer and to project from the substrate side recess to the electrode of the feeder terminal portion, and
   in the mechanical joining, the substrate side electrode is fit into the recess of the feeder terminal portion and contacts the electrode of the feeder terminal portion.

4. The production method for an electrostatic chuck according to claim 3, wherein the electrode provided in the feeder terminal portion is made of an elastic body.

* * * * *